(12) United States Patent
Shinriki et al.

(10) Patent No.: US 7,273,526 B2
(45) Date of Patent: *Sep. 25, 2007

(54) THIN-FILM DEPOSITION APPARATUS

(75) Inventors: Hiroshi Shinriki, Tama (JP); Junichi Arami, Tama (JP)

(73) Assignee: ASM Japan K.K., Tokyo (JP)

( * ) Notice: Subject to any disclaimer, the term of this patent is extended or adjusted under 35 U.S.C. 154(b) by 54 days.

This patent is subject to a terminal disclaimer.

(21) Appl. No.: 10/824,798

(22) Filed: Apr. 15, 2004

(65) Prior Publication Data

US 2005/0229848 A1    Oct. 20, 2005

(51) Int. Cl.
 C23C 16/44    (2006.01)
 C23C 16/455   (2006.01)
 C23F 1/00     (2006.01)
 H01L 21/306   (2006.01)
 C23C 16/34    (2006.01)
(52) U.S. Cl. .............. 118/715; 156/345.33; 156/345.34
(58) Field of Classification Search ............ 118/723 E; 156/345.43–47
 See application file for complete search history.

(56) References Cited

U.S. PATENT DOCUMENTS 5,656,123 A * 8/1997 Salimian et al. ....... 156/345.43
5,685,914 A * 11/1997 Hills et al. ................ 118/723 E
5,884,009 A * 3/1999 Okase .......................... 392/418
6,435,428 B2 * 8/2002 Kim et al. .................... 239/553
2003/0143328 A1  7/2003 Chen et al. ............ 427/255.28
2005/0208217 A1 * 9/2005 Shinriki et al. .......... 427/248.1

OTHER PUBLICATIONS

U.S. Appl. No. 10/728,126, filed Dec. 3, 2003, Ernst H.A. Granneman.
U.S. Appl. No. 10/782,727, filed Feb. 18, 2004, Lindfors, et al.

* cited by examiner

*Primary Examiner*—Rudy Zervigon
(74) *Attorney, Agent, or Firm*—Knobbe, Martens, Olson & Bear LLP

(57) ABSTRACT

A gas-feeding apparatus configured to be connected to an evacuatable reaction chamber includes a gas-distribution head for introducing gases into the chamber through a head surface. The gas-feeding head includes a first section for discharging a gas through the head surface toward a susceptor and a second section for discharging a gas through the head surface toward the susceptor. The first and the second sections are isolated from each other in the gas-distribution head, at least one of which section is coupled to an exhaust system for purging therefrom a gas present in the corresponding section without passing through the head surface.

31 Claims, 10 Drawing Sheets

| Time | | step1 | step2 | step3 | step4 | step5 | step6 | step7 |
|---|---|---|---|---|---|---|---|---|
| | | set time | set time | set time | set time | set time | set time | set time |
| gas valve | 20 | open | open | open | open | open | open | open |
| | 21 | close | open | close | close | close | close | close |
| | 22 | close | close | close | open | close | close | close |
| | 23 | open | open | open | open | open | open | open |
| | 24 | close | close | close | close | close | | |
| vacuum exhaust valve | 25 | open | open | open | open | open | open | open |
| | 9 | close | close | open | open | close | close | close |
| | 32 | close | close | close | close | close | close | open |

Fig. 3

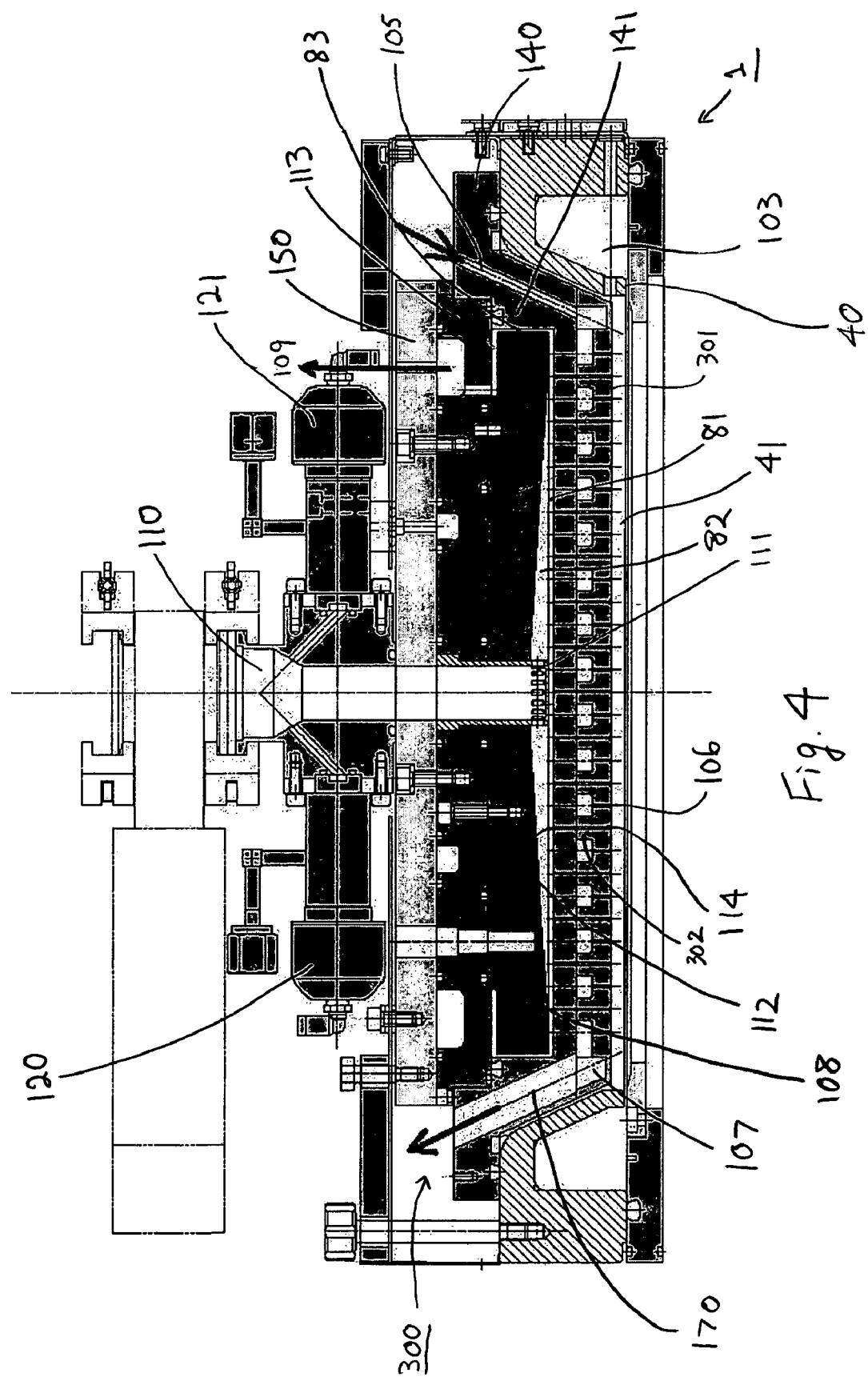

| | | step1 | step2 | step3 | step4 | step5 | step6 | step7 | step8 | step9 |
|---|---|---|---|---|---|---|---|---|---|---|
| | Time | set time | set time | set time | set time | set time | set time | set time | set time | set time |
| gas valve | 20 | open | open | open | open | open | open | open | open | open |
| | 21 | close | open | close | close | close | close | close | close | close |
| | 22 | close | close | close | open | close | close | close | close | close |
| | 23 | open | open | open | open | open | open | open | open | open |
| | 24 | close | close | close | close | close | open | open | open | close |
| Plasma | | off | off | off | off | off | off | on | off | off |
| vacuum exhaust | 25 | open | open | open | open | open | open | open | open | open |
| | 9 | close | close | close | open | close | close | close | close | close |
| valve | 32 | close | close | close | close | close | close | close | close | open |

Fig.6

THIN-FILM DEPOSITION APPARATUS

BACKGROUND OF THE INVENTION

1. Field of the Invention

The present invention relates to a single-wafer type thin-film deposition apparatus which deposits a thin film onto a substrate to be treated. The present invention particularly relates to a gas-feeding apparatus adapted to be installed in an thin-film deposition apparatus.

2. Description of the Related Art

As for a thin-film deposition apparatus used for atomic layer growth processing, material gases can be fed onto a substrate surface at a uniform gas concentration using a showerhead system. In contrast, in a laminar flow system, gas concentrations upstream and downstream of a gas controller tend to vary. To feed gases uniformly onto the substrate surface using a showerhead, material gases are fed from a distribution plate having relatively small conductance after the gases pool inside the showerhead. Consequently, after a first gas is fed, the first gas remaining is exhausted by feeding a second gas, and then a third gas is fed. When the third gas is fed, if the first gas still remains, solid matters are formed by a vapor-phase chemical reaction. For this reason, when the third gas is fed, it is required to exhaust all the remaining gas within the distribution apparatus thoroughly. Particularly, when a material gas with a low vapor pressure is used, an exhaust time required for exhausting the remaining gas increases.

SUMMARY OF THE INVENTION

In the showerhead system, a precursor can be fed onto a substrate at a uniform concentration distribution or at a prescribed concentration distribution. To achieve a uniform concentration distribution, controlling of conductance from the showerhead to the substrate by a distribution plate is necessary, which triggers hindering of reaction gas purging from the showerhead. Because at least two different reaction gases are fed alternately, after Reaction Gas A is fed, Reaction Gas B often can be fed only after purging Reaction Gas A is completed. Thus, an approach to feed Reaction Gas A and Reaction Gas B uniformly from the showerhead via different gas paths, hence, is effective, wherein Reaction Gas A and Reaction Gas B are made to react only on a substrate surface.

Additionally, as another approach to quickly purge Reaction Gases A and B from the showerhead respectively, an exhaust port is provided on at least one side to evacuate the inside of the showerhead in a short period of time during gas purging. This method is able to solve a problem, which conventionally hinders atomic layer deposition by the showerhead.

As to an ALD using a plasma, a plasma is not applied to Reaction Gas A; in most cases, a plasma is applied to Reaction Gas B to activate it. In this case as well, a different gas path can effectively be set up inside the showerhead, wherein a plasma can be generated over the substrate surface, or a space for generating a plasma can be formed inside the showerhead. For a low-vapor-pressure metal, it may be introduced onto the substrate surface without generating a plasma, whereas a gas for generating a plasma used for oxidizing, nitriding, or reducing adsorbing organic metal materials may include oxygen, nitrogen, and hydrogen which can be purged easily. The purging of the low-vapor pressure metal material is not fast and if the material remains, it will react with the gas plasma in the showerhead or generate particles on the substrate. Consequently, for a portion for which a low-vapor-pressure metal material is distributed, extremely quick gas purging is required; for other gases, purging may not be critical. In US 2003/0143328A1, although the feeding of a low-vapor-pressure material gas and the feeding of any other material gases are conducted through respective different paths, the low-vapor-pressure material gas is discharged from a lower portion provided facing a substrate surface (the gases for plasma generation are provided in an upper portion above the lower portion), and thus there is not a sufficient space to distribute the gas symmetrically with respect to the center point of a wafer, and furthermore it is difficult to purge the gas efficiently (no separate exhaust system is provided).

In view of the foregoing, in an embodiment, the present invention provides a gas-feeding apparatus configured to be connected to an evacuatable reaction chamber provided with a support for placing a substrate thereon, comprising: a gas-distribution head for introducing gases into the chamber through a head surface, which gas-distribution head comprises a first section for discharging a gas through the head surface toward the support and a second section for discharging a gas through the head surface toward the support, said first and said second sections being isolated from each other in the gas-distribution head, at least one of which section is coupled to an exhaust system for exhausting a gas present in the corresponding section without passing through the head surface. In the above embodiment, the gas-feeding apparatus comprises multiple gas lines or systems, at least one of which is coupled to an exhaust system, so that multiple gases can be used very efficiently due to rapid or instant purging operation. The gas present in the section can be purged without passing through the head surface, e.g., a showerhead lower surface having a plurality of bores. A low-vapor pressure primary material and a low molecular weight secondary material can be effectively used.

In another embodiment, the present invention provides a thin-film deposition apparatus comprising: (i) an evacuatable reaction chamber provided with a support for placing a substrate thereon; and (ii) the gas-feeding apparatus described above. By using the gas-feeding apparatus in a thin-film deposition apparatus such as a CVD apparatus (e.g., a PECVD or thermal CVD), deposition of thin films can be accomplished in a shortened cycle. Because purging is performed virtually instantly, gases can be switched to form a laminate structure.

In an embodiment of the present invention, a method for forming a thin film on a substrate comprises: (i) placing a substrate in an interior of a reaction chamber; (ii) introducing a first gas into the interior of the reaction chamber via a first path of a showerhead through a showerhead surface, wherein the first gas is introduced from an upstream side of the showerhead surface, and the interior of the reaction chamber is on a downstream side of the showerhead surface; (iii) purging the first path of the showerhead with a purge gas while evacuating the first path from the upstream side of the showerhead surface; and (iv) introducing a second gas into the interior of the reaction chamber via a second path of the showerhead through the showerhead surface, wherein the first path and the second path are isolated from each other in the showerhead, thereby reacting the first gas and the second gas and depositing a film on the substrate. More than two types of gases can also be used.

In a preferably embodiment, the present invention provides a gas-feeding apparatus adapted to be connected to an evacuatable reaction chamber for, e.g., atomic layer growth processing or layer-by-layer thin-film processing. The apparatus may comprise: (a) a distribution plate; (b) a first plate having first bores through which a first gas passes, wherein a first section is formed between the distribution plate and the first plate, wherein the first gas is introduced into the first section and passes through the first bores; and (c) a second plate having second bores through which a second gas passes, wherein a second section is formed between the first plate and the second plate, wherein the second gas is introduced into the second section and passes through the second bores, said second plate having third bores through which the first gas passes, wherein the second section is provided with connectors which connect the respective first bores and the respective third bores in the second section without being communicated with the second bores, wherein at least one of the first section or the second section is coupled to an exhaust system which discharges the gas in the corresponding section without passing through the corresponding bores.

In yet another embodiment, the present invention is characterized in that a showerhead used for, e.g., atomic layer growth processing by feeding two or more different gases alternately has two or more separate gas-distribution paths, and that a means for exhausting the inside of the showerhead, which is communicated with at least one gas-distribution path. Additionally, in this embodiment, a plasma can be generated either between the showerhead and a substrate surface, or inside the showerhead. Additionally, in an embodiment, when a plasma is generated, the present invention may be characterized in that a gas-distribution portion not communicated with an exhaust path is at least provided on the substrate side, rather a gas-distribution portion communicated with the exhaust path is provided. Even if the gas-distribution portion not communicated with an exhaust path is provided on the substrate side, it is possible to make it communicated with an exhaust path disposed downstream of the showerhead. Providing an exhaust path on a side which is more remote from a substrate than the other side, however, makes the path more efficient, hence advantageous. This may be because it is difficult to feed a low-vapor-pressure material gas under high pressure, and to introduce a low-vapor-pressure material gas into the showerhead under relatively low pressure, a sufficient capacity or space for diffusing the gas may be required. For this purpose, in an embodiment, providing a distribution chamber with a larger capacity on the side away from the substrate is advantageous. Additionally, because this structure allows the gas to be introduced to the center of the chamber, the gas can be distributed more uniformly.

As described above, using a post-mixing type showerhead, a thin-film deposition apparatus according to an embodiment of the present invention is able to feed material gases extremely uniformly while vapor-phase reaction of material gases having high reactivity is controlled by setting up a dedicated exhaust port with a valve which opens/closes rapidly, or a variable conductance valve in respective gas-distribution chambers, wherein purging the remaining gas can be completed at high speeds, e.g., in about 10 msec to about 500 msec (including 25 msec, 50 msec, 100 msec, 200 msec, 300 msec, and ranges of any two of the foregoing, preferably about 50 msec to about 100 msec), depending on the conductance of the exhaust system. Conventionally, evacuating the reaction gas remaining inside the showerhead in a short period of time was not feasible. Consequently, in an embodiment of the present invention, it becomes possible to form a uniform thin film with high productivity rates, which never could be achieved before, and with no or fewer particles. Additionally, in the case of a reaction, which becomes chemically active only when RF is applied to one of gases, stopping plasma application stops the reaction, hence no purging is required for the one of gases. In this case, by setting up a dedicated exhaust port and an exhaust valve only in a distribution chamber to which a metal material gas is introduced, a thin film can be formed extremely efficiently.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 3 is a chart showing valve operation for atomic layer growth in an embodiment of the present invention.

FIG. 4 is a schematic cross sectional view showing a gas-feeding apparatus according to an embodiment of the present invention.

FIG. 6 is a chart showing valve operation for atomic layer growth in an embodiment of the present invention.

DETAILED DESCRIPTION OF THE PREFERRED EMBODIMENT

Figure 1:
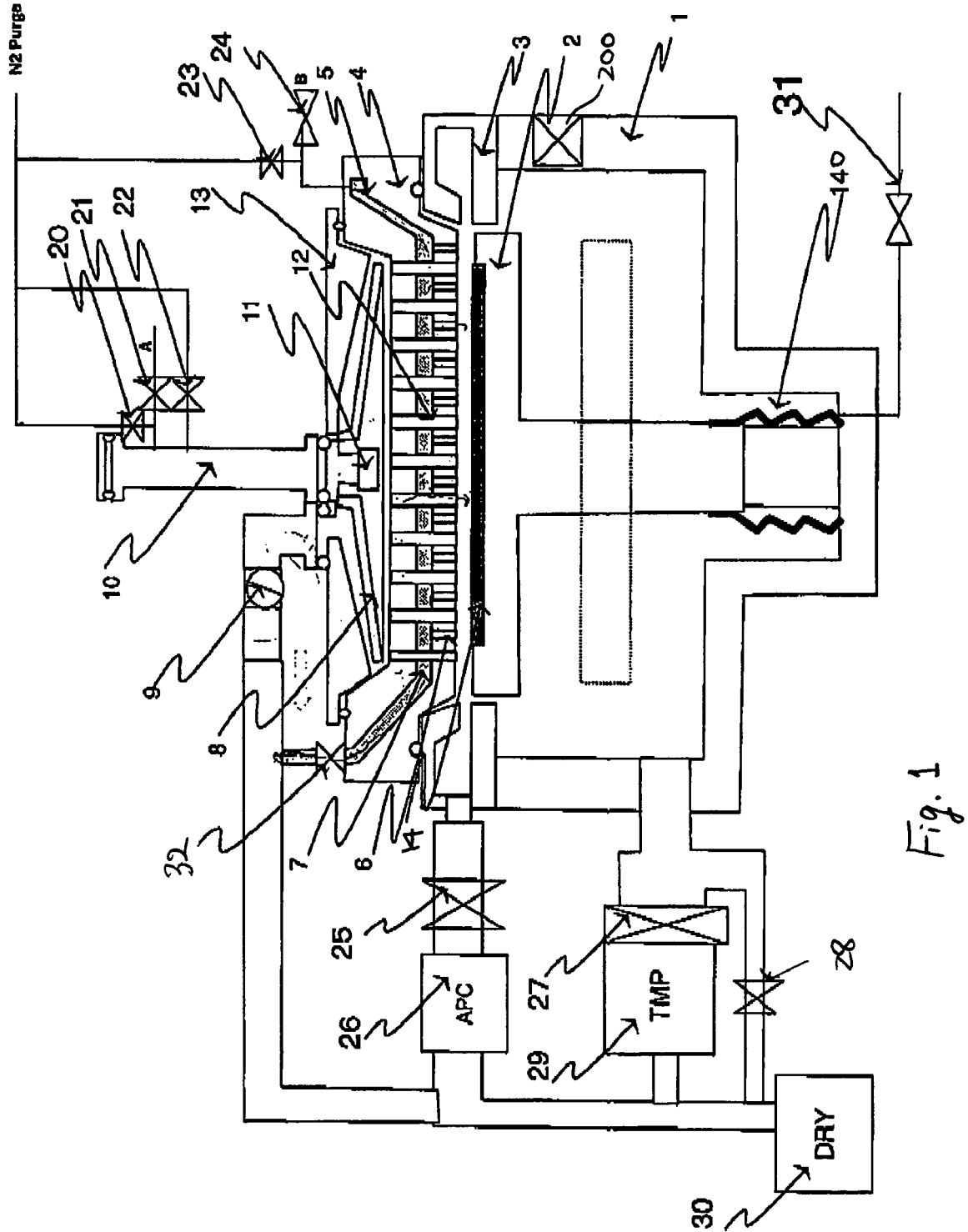
FIG. 1 is a schematic view showing an thin-film deposition apparatus according to an embodiment of the present invention.

The invention will be explained further with reference to specific embodiments, but the invention should not be limited thereto.

As explained above, in an embodiment of the present invention, a gas-feeding apparatus is configured to be connected to an evacuatable reaction chamber provided with a support for placing a substrate thereon and comprises: a gas-distribution head for introducing gases into the chamber through a head surface. The gas-distribution head (e.g., a showerhead) comprises a first section for discharging a gas through the head surface toward the support and a second section for discharging a gas through the head surface toward the support. The first and the second sections are isolated from each other in the gas-distribution head, at least one of which section is coupled to an exhaust system for exhausting a gas present in the corresponding section without passing through the head surface. The gas-distribution head can comprise more than two sections such as three or four sections, as long as gases are discharged uniformly from each section to the interior of the reaction chamber.

In the above, in a preferred embodiment, the first section and the second section are each disposed parallel to the head surface, wherein the second section is closer to the head surface than is the first section, wherein at least the first section is coupled to the exhaust system. Each section has a section arranged parallel to the head surface, and further, each section is communicated with the head surface (e.g., a lower showerhead surface) via bores, so that the discharging of each gas can be performed uniformly with respect to the head surface toward the susceptor. In this configuration, if more section layers are layered, gases from the section layers away from the head surface travel more until they reach the head surface, which may tend to cause non-uniform distribution. In an embodiment, the exhaust system is coupled to the remote section from the head surface, and thus, the purging of gas can be instantly completed, and multiple gases can share the same section without slowing the processing speed or without increasing particle contamination.

In an embodiment, atomic layer growth reaction is controlled as a function of physical contact of multiple gases with each other (temperature is not easy to be controlled responsively), and in that case, the purging of each gas may be effective and each section may be coupled to an exhaust system. Preferably, the first section where a more difficult gas to distribute flows has a volume which is larger than that of the second section where a less difficult gas to distribute flows.

In an embodiment, the first section reaches the head surface through the second section without being communicated with each other. The head surface may be shared by multiple gases discharged from the respective sections, and thus, in order to uniformly discharged the respective gases at any given location on the head surface, it may be preferable to dispose the first section and the second section parallel to the head surface and communicate each with the head surface through a plurality of bores without communicating the first section and the second section.

When using a difficult gas to distribute such as a low-vapor pressure material gas, gas flow directions may be important in an embodiment. If the first section comprises a central distribution inlet and a cone-shaped distribution plate extending radially therefrom, localized gas flow can be prevented. The cone-shaped distribution plate may have a bottom plate having curved or straight slits arranged symmetrically with respect to the center of the bottom plate in the vicinity of the outer periphery of the bottom plate.

The foregoing configurations can be adopted regardless of whether each section or only one section is coupled to an exhaust system.

In an embodiment, the bores communicating the second section and the head surface are disposed predominantly in a central area of the head surface, whereas the bores communicating the first section and the head surface are uniformly distributed on the head surface. This embodiment may be suitable for a gas easy to distribute and purge. Preferably, the second section has a longitudinal shape in the gas-distribution head, so that gas flow can be controlled very responsively, especially when the second section is coupled to an exhaust system. In this case, the second section is a pipe-like section having a central area.

In an embodiment, the bores communicating the first section and the head surface may have a total opening area on the head surface which is larger than that of the bores communicating the second section and the head surface. In this configuration, a more difficult gas to distribute and purge (e.g., a gas having a larger molecular weight) flows through the first section and its bores, and an easier gas to distribute and purge (e.g., a gas having a smaller molecular weight) flows through the second section. Likewise, the bores communicating the first section and the head surface may have an average bore size (e.g., 0.2-5 mm, including 0.5 mm, 1.0 mm, 1.5 mm, 2.0 mm, 3.0 mm, and ranges between any of the foregoing, preferably 0.5-2.0 mm) which is larger (e.g., by 50%-200%) than that of the bores communicating the second section and the head surface (e.g., 0.1-3.0 mm, including 0.2 mm, 0.5 mm, 1.0 mm, 2.0 mm, and ranges between any of the foregoing, preferably 0.2-1.0 mm). The size of bores can be changed from the center to the outer periphery or can be uniform throughout the head surface. For example, when the cone-shaped distribution plate with a bottom plate having slits in the vicinity of the outer periphery is used, the first section may have bores having a larger size at a central area and bores having a smaller size toward the outer periphery. Further, if the bores communicating the second section and the head surface are arranged exclusively at a central area, the size of the bores may be as large as or larger than that of the bores communicating the first section and the head surface.

The gas-distribution apparatus may further comprise an RF power, source for exerting RF power exclusively onto an interior of the second section so that RF power can be applied to a second gas to generate a plasma. The excited second gas is discharged from the head surface and reacts with a first gas discharged also from the head surface, thereby depositing a thin film on a substrate. In an embodiment, the RF power source is coupled to a bottom plate of the first section which physically separates and insulates the first section from the second section, and the head surface is set at no electric potential. In another embodiment, an RF power source may be coupled to the gas-distribution head to exert PR power onto an interior of the reaction chamber. Application of RF power can be controlled responsively, and thus, even if the purging of the second gas is not instantly accomplished, by stopping RF power, the reaction between the first gas and the second gas can be severed. The purging of the second gas can be accomplished by a main exhaust system which exhausts gases present in the interior of the reaction chamber. Preferably, the main exhaust system comprises an annular slit surrounding the substrate or the susceptor and a duct connected to a vacuum pump. The gas present in the second section can be purged through the bores and the annular slit.

In an embodiment, a purging gas and a plasma generating gas may be different, both of which are discharged from the second section, especially when the second section is coupled to an exhaust system connected directly to the gas-distribution head, not through the interior of the reaction chamber.

In an embodiment, the first section is coupled to a source gas line and a purge gas line, and the second section is coupled to an additive gas line and a purge gas line. In another embodiment, each exhaust system can be a separate system.

In another aspect of the present invention, a thin-film deposition apparatus comprises: (i) an evacuatable reaction chamber provided with a support for placing a substrate thereon; and (ii) the gas-feeding apparatus described above comprising any of the foregoing elements.

In a preferred embodiment, the exhaust system for evacuating the gas-distribution head and the exhaust system for evacuating the space between the head surface and the support are connected and merged to a single exhaust line, so that by valve operation, it is possible to control the purging of each section and spaced using a single exhaust pump. In an embodiment, the exhaust system connected to the first section may use a valve having a diameter such that the interior of the first section can be evacuated instantly, e.g., about 40 mm in diameter. If the volume of the second section is smaller than that of the first section, the exhaust system connected to the second section may use a valve having a smaller diameter than the valve used for the first section. In an embodiment, the second section has a longitudinal shape (e.g., a pipe like shape having a central area), and in that case, the section may have as small a diameter as about ¼ inches.

The present invention can equally be applied to a method for forming a thin film on a substrate comprising: (i) placing a substrate in an interior of a reaction chamber; (ii) introducing a first gas into the interior of the reaction chamber via a first path of a showerhead through a showerhead surface, wherein the first gas is introduced from an upstream side of the showerhead surface, and the interior of the reaction chamber is on a downstream side of the showerhead surface; (iii) purging the first path of the showerhead with a purge gas while evacuating the first path from the upstream side of the showerhead surface; and (iv) introducing a second gas into the interior of the reaction chamber via a second path of the showerhead through the showerhead surface, wherein the first path and the second path are isolated from each other in the showerhead, thereby reacting the first gas and the second gas and depositing a film on the substrate. The method may include, but are not limited to, the following embodiments:

The method may further comprise (v) purging the second path of the showerhead with a purge gas while evacuating the second path from the upstream of the showerhead surface. Steps (ii) though (v) may constitute one cycle and are repeated. A third gas in place of the first gas can be used alternately with the first gas. In step (iv), the second gas may be introduced from a central area of the showerhead. The interior of the reaction chamber may be constantly evacuated from the downstream of the showerhead surface. The method may further comprise (vi) purging the interior of the reaction chamber with a purge gas while evacuating the interior of the reaction chamber from the downstream of the showerhead surface. The method may further comprise exerting RF power onto the second gas when flowing in the second path in the showerhead. The method may further comprise exerting RF power onto the interior of the reaction chamber. In the foregoing, any steps in an embodiment can interchangeably be adopted in another embodiment.

The method is preferably used for atomic layer growth processing (e.g., one layer is one atom thick), although it can be applied generally to layer-by-layer thin-film processing. In the atomic layer growth processing, one cycle is controlled by deposition speed of atoms, e.g., fill speed and purging speed which also depend on their molecular size. If the previous gas is not sufficiently purged, the current gas reacts with the previous gas in the interior of the reaction chamber upstream of the substrate, resulting in an atomic layer which is unnecessarily thicker than it should be and which includes a layer formed by non-atomic layer growth. In an embodiment of the present invention, because the purging of gas can be accomplished instantly, one cycle can be significantly shortened. Although it depends on the type of gas and its molecular size, in an embodiment, the purging can be completed in about 0.1 second whereas the introduction of gas can be completed in about 0.1 second to about 1.0 second. Further, in an embodiment, when applying RF power to a plasma-generating gas, RF power is initiated about 0.1 second to about 0.3 second after the introduction of the plasma-generating gas (for the purpose of stabilizing the vacuum pressure) and the RF power is applied for about 0.1 second to about 0.3 second.

In yet another aspect of the invention, a gas-feeding apparatus is adapted to be connected to an evacuatable reaction chamber for atomic layer growth processing and comprises: (a) a distribution plate; (b) a first plate having first bores through which a first gas passes, wherein a first section is formed between the distribution plate and the first plate, wherein the first gas is introduced into the first section and passes through the first bores; and (c) a second plate having second bores through which a second gas passes, wherein a second section is formed between the first plate and the second plate, wherein the second gas is introduced into the second section and passes through the second bores, said second plate having third bores through which the first gas passes, wherein the second section is provided with connectors which connect the respective first bores and the respective third bores in the second section without being communicated with the second bores, wherein at least one of the first section or the second section is coupled to an exhaust system which discharges the gas in the corresponding section without passing through the corresponding bores. The gas-feeding apparatus includes, but is not limited to, the following embodiments:

The first plate and the second plate may be disposed parallel to each other, and the distribution plate may have a cone shape. The distribution plate may be provided with a first gas inlet disposed in a central area of the distribution plate for introducing the first gas into the first section. The second section may be provided with a second gas inlet disposed in the vicinity of an outer periphery of the second section. The first section may be coupled to the exhaust system, wherein the first gas present in the first section is exhausted around an outer periphery of the distribution plate. The second section may be coupled to the exhaust system, wherein the second gas present in the second section is exhausted through a second gas outlet disposed in the vicinity of an outer periphery of the second section. The second bores may be disposed predominantly in a central area of the second plate. The first bores may be distributed uniformly on the first plate, and the third bores may be disposed right under the respective first bores. The third bores may have a total opening area which is larger than that of the second bores. The third bores may have an average bore size which is larger than that of the second bores. The second section may be coupled to the exhaust system and may be provided with a second gas inlet and a second gas outlet near an outer periphery of the second section, wherein the second section has a longitudinal shape from the inlet to the outlet via the central area having the second bores.

In the foregoing, any elements in an embodiment can be interchangeably with other elements in another embodiment.

The invention will be explained in detail with reference to the drawings, but the invention should not be limited thereto.

FIG. 1 shows a structure of a thin-film deposition apparatus according to an embodiment of the present invention. The thin-film deposition apparatus conveys a semiconductor substrate, which is an object to be treated, from a vacuum transfer chamber (not shown) to a reaction chamber 1 from a gate vale 200 and can implement a thin-film deposition process in this reaction chamber 1. The substrate 14 transferred is placed on a susceptor 2; the inside of the reaction chamber can be evacuated by a molecular pump (TMP) 29 through a valve 27 or a gate valve 28. After this, the substrate susceptor 2 is raised using bellows 140 and is positioned at the most appropriate distance from a shower plate 4. It is designed that, after reaction gas hereby is fed from the shower plate, it is fed to a surface of the substrate 14, and is discharged via an exhaust duct 3. At this time, by feeding an inert gas by opening a valve 31, diffusion of the reaction gas fed from the shower plate 4 to the transfer-chamber side where the bellows are, can be prevented.

The reaction chamber comprises layering of the exhaust duct 3, the shower plate 4 and an upper lid 13; between the shower plate 4 and the upper lid 13, there are a gas-distribution nozzle 11, and further a gas-distribution guide 8, which are communicated with a gas conduit tube 10.

Figure 2:
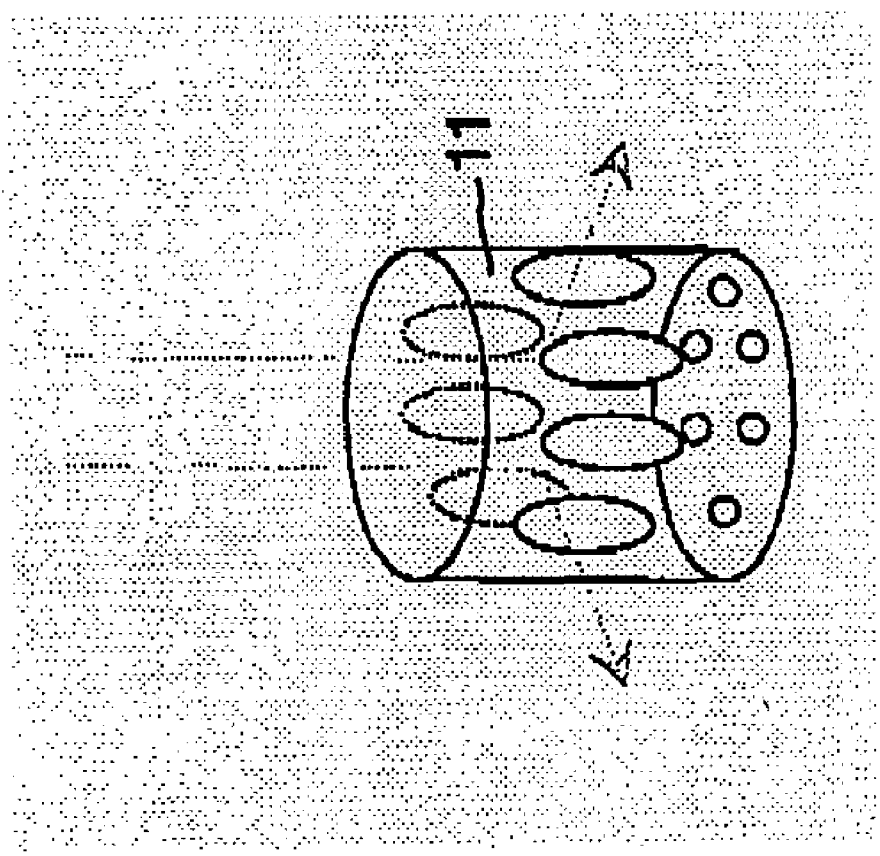
FIG. 2 is a schematic view of an gas distribution plate usable in an embodiment of the present invention.

The gas-distribution nozzle 11 may have a structure shown in FIG. 2 (which does not reflect the actual proportions and sizes). That is, the nozzle 11 may have multiple openings on a sidewall and a bottom, through which a gas passes. When the gas guide 8 has a bottom plate having openings or slits toward the outer periphery of the bottom plate, a gas flows sideways from the nozzle towards the slits and then flows into above the shower plate surface having multiple holes or bores.

Further, along the gas-distribution guide 8, an exhaust valve 9 used for evacuating the distribution portion is connected. Additionally, a gas-introduction portion 5, a gas-introduction valve 24 and a valve 32 used for evacuation of gas are connected to the shower plate 4. A valve 23 used for introducing an inert gas for purging use is also connected to the shower plate 4. A gas-introduction valve 21 and a valve 20 used for introducing an inert gas are connected to the gas conduit tube 10. Material gases are introduced from the valve 21. Additionally, a valve 22 used for introducing a large flow of an inert gas is formed.

After introduced from the valve 21 to the gas conduit tube 10 and distributed by the gas-distribution nozzle 11 and passing along the gas-distribution guide, Gas A goes through a gas discharge hole 12 penetrating the shower plate 4 and is fed onto the substrate 14. Gas B fed from the gas valve 24 is distributed inside the gas-distribution chamber 7 via the gas-introduction portion 5 set up inside the shower plate 4 and is fed onto the substrate 14 from the gas discharge hole 6. Additionally, the gases fed onto the substrate 14 are exhausted by a vacuum pump 30 via the exhaust duct 3, and via an exhaust valve 25 and a pressure controller (APC) 26.

At reaction gas purging, an inert gas is introduced from the gas valves 20 and 22, and then the valve 9 is opened and remaining Gas A is exhausted from the exhaust valve 9. At this time, although the gas is exhausted from the exhaust duct 3 as well as via the exhaust Valve 9, most of remaining gas is discharged via the exhaust valve 9 because an exhaust conductance level from the valve 9 is designed to be at a one-digit higher than the other (i.e., inside the shower plate). In an embodiment, the conductance of the valve 9 may be 3-100 times, preferably 10-50 times, that of the inside of the shower plate. When Gas B fed from the gas valve 24 is purged, an inert gas is similarly introduced from the valve 23; the exhaust valve 32 is opened to discharge remaining gas. At this time, although there may be gas exhausted from the gas discharge hole 6 via the exhaust duct 3, most of gas is discharged via the exhaust valve 32 because gas discharge conductance for the exhaust valve 32 is larger. In an embodiment, the conductance of the exhaust valve 32 may be 3-50 times, preferably 5-30 times, that of the inside of the shower plate.

Using the above-mentioned functions, an atomic layer growth process, in which reaction gases A and B are fed alternately, or the most suitable process apparatus for layer-by-layer thin-film deposition process can be provided.

FIG. 4 is a schematic cross sectional view showing in detail an embodiment of the gas-feeding apparatus including a gas-distribution head 300. This figures does not show a substrate heating support or susceptor and all gas valves. A first gas such as a low-vapor pressure material gas is introduced to a central gas pipe 110 through a gas line 121. The first gas is then introduced into a first compartment 82 of a gas guide (distribution plate) 108 through a gas-distribution plate 111. The first compartment 82 has a bottom plate having slits, and the first gas passes through the slits and flows into a second compartment 81 which is above an upper surface of an upper shower plate (a first plate) 141 having a plurality of bores (first bores) 112. The first compartment 82 and the second compartment 81 constitute a first section. When the first compartment 82 does not have a bottom plate, there is no clear boundary between the first compartment 82 and the second compartment 81. The first gas is then discharged to an interior 41 of a reaction chamber 1 through the bores 112 and bores (third bores) 114 which are connected by connectors 302 and which are formed in a lower shower plate (a second plate) 140 having a head surface 301. The bores 112 and 114 are aligned and connected. During the above process, the interior 41 is constantly exhausted using an exhaust duct 103 through an annular slit 40, wherein the gas is drawn radially toward the outer periphery of the interior 41.

The gas guide 108 is fixed to the upper shower plate 141 via an upper lid plate 113 above which an insulation plate 150 is placed. The lid plate 113 and the gas guide 108 need not be separate pieces but can be made of a single piece if feasible. The gas guide 108 and the upper shower plate 141 do not directly contact each other, and an annular gap 83 is formed along the outer periphery of the gas guide 108. This annular gap 83 is connected to an exhaust vale 109 (not shown) through the upper lid plate 113.

When purging the first section 81, 82, a purge gas is introduced thereto through a gas line 120, the central gas pipe 110, and the gas-distribution plate 111. Simultaneously, the first section is evacuated using the exhaust valve 109 through the annular gap 83. Although the interior 41 is constantly evacuated through the slit 40 and the exhaust duct 103, the conductance of the exhaust valve 109 is significantly greater than that of the slit 40, and thus, the gas present in the first section is drawn predominantly and instantly in the direction of the exhaust valve 109. Accordingly, the purging of the first section is completed instantly, and also, the purging of the interior 41 can be completed instantly by using the exhaust valve 109 and the slit 40.

A second gas is introduced to a second section 107 from a gas feed port 105. The second section 107 is not communicated with the first section 81, 82. The plurality of bores 112 is connected to the bores 114 which are formed in the lower shower plate 140 without being communicated with the second section 107. The second gas is discharged to the interior 41 of the chamber 1 through bores (second bores) 106. The purging the second section 107 can be accomplished using an exhaust path 170 which has a larger path than that of the gas feed port 105, so that the conductance of the exhaust path 170 is greater than that of the slit 40. The purging of the second section 107 can be accomplished instantly using the exhaust path 170.

The number of the bores 112 in the upper shower plate 141 is not limited, but may be 50-2,000, preferably 500 to 1,500, in an embodiment. The number of the bores 106 in the lower shower plate 140 is not limited, but may be 5-2,000, preferably 10-1,000, and in an embodiment where the section is longitudinal, preferably 10-100. In general, the number of the bores 112 is greater than that of the bores 106. The number of the bores 114 may be equal to that of the bores 112, although it is possible to use two or more of bores 114 per one of bores 112.

FIG. 3 is a table showing gas introduction sequences using the structure shown in FIG. 1 (FIG. 4). Process steps using Reaction Gases A and B are shown. Typical valve actions when the gases A and B are introduced alternately as the basic sequence are shown.

Figure 5:
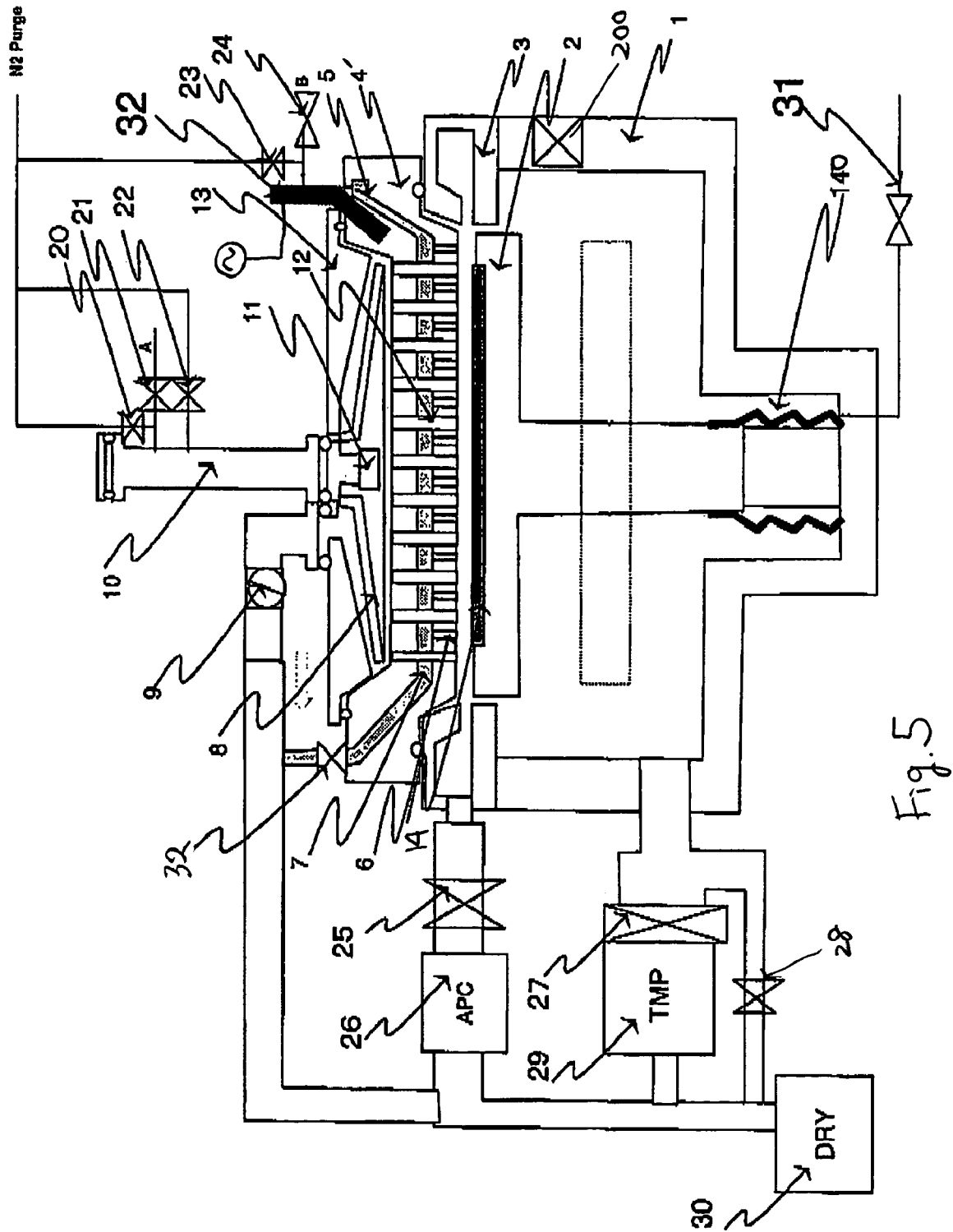
FIG. 5 is a schematic view showing an thin-film deposition apparatus according to an embodiment of the present invention, wherein RF power is applied between the showerhead and the susceptor.
Figure 7:
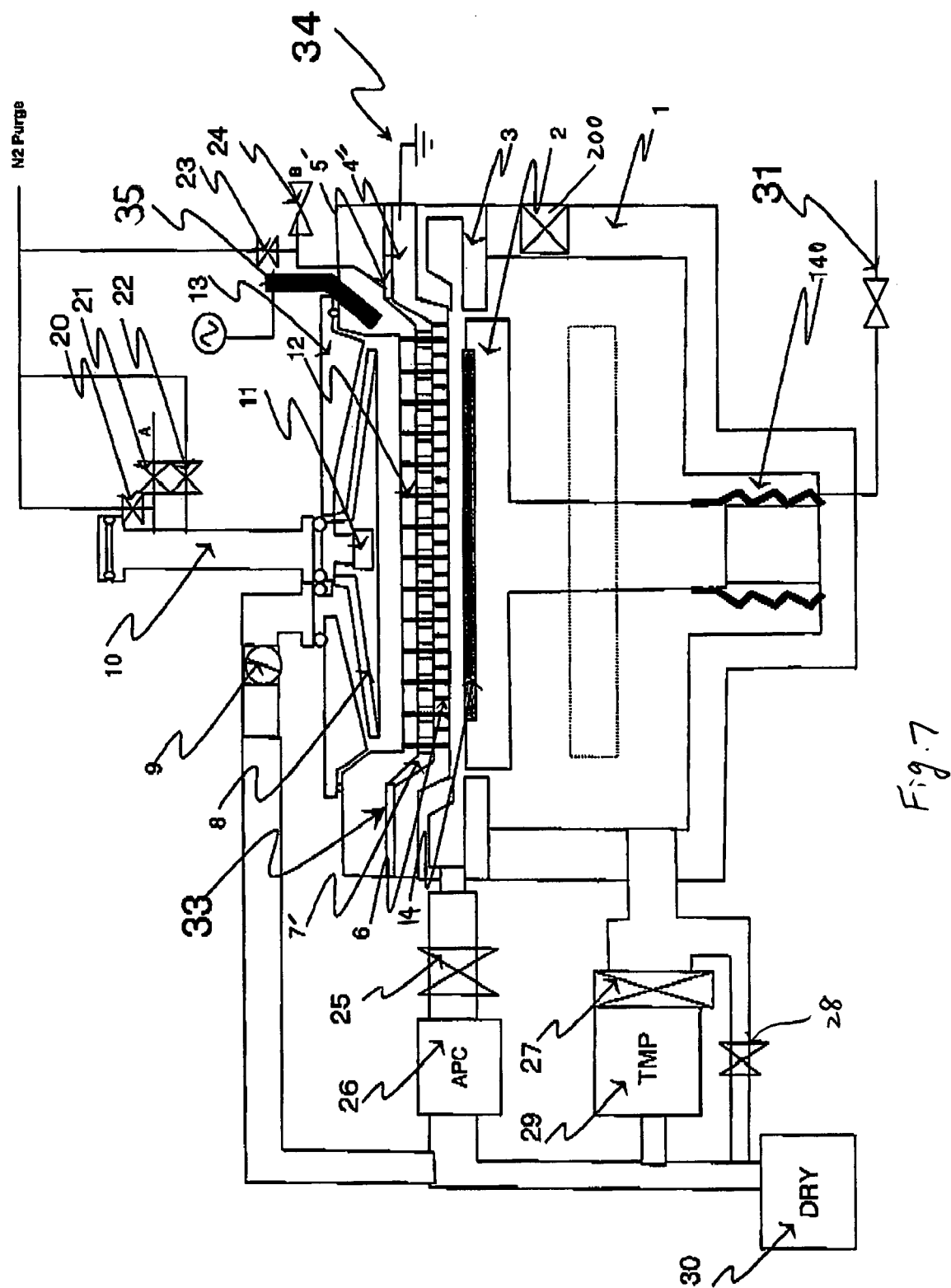
FIG. 7 is a schematic view showing an thin-film deposition apparatus according to an embodiment of the present invention, wherein RF power is applied in the showerhead.

FIG. 5 shows a cross-section structure of a thin-film deposition apparatus according to an embodiment of the present invention. Different from FIG. 1, in the figure, the apparatus further comprises a structure for RF plasma generation. FIG. 7 shows a cross-section structure of a thin-film deposition apparatus according to another embodiment of the present invention. Different from FIG. 5, in this figure, this apparatus is characterized in that an RF plasma is generated inside the gas-distribution chamber. Additionally, an exhaust valve from which gas inside the gas-distribution chamber is exhausted is set up only for a chamber in which metal material gases are distributed and is not set up in a distribution chamber in which plasma is generated.

In the apparatus shown in FIG. 5, an RF introduction terminal 32 is installed in a shower plate 4', and the susceptor 2 is set at zero electric potential, so that a plasma is generated in the interior of the chamber between the shower plate and the susceptor (a substrate). The remaining structures can be the same as in the apparatus shown in FIG. 1.

In the apparatus shown in FIG. 7, an RF introduction terminal 35 is installed in a shower plate 4" which is grounded 34 and separated from a lower portion of the shower plate 4" with an insulation ring 33, so that a plasma is generated in the shower plate (in the second section 7'). In this embodiment, reaction (excitation of the gas) can be controlled by the introduction of RF power, and thus, the purging of the second section is not critical even if some gas remains in the second section (the first gas does not react with the second gas if the second gas is not excited by a plasma). Thus, in this embodiment, the shower plate 4" does not have an exhaust path coupled to the second section. The second gas is introduced to the second section through a gas feed port 5', and is discharged through the bores 6 to the exhaust duct 3. Further, in this embodiment, the first section has a larger volume than in FIG. 1, so that the first gas is more uniformly discharged from the shower plate and reacts with the excited second gas, thereby depositing a thin film on a substrate. The remaining structures can be the same as in the apparatus shown in FIG. 1.

FIG. 6 is a table showing gas introduction sequences using the structure shown in FIG. 5. Process steps using Reaction Gases A and B are shown. Typical valve actions and plasma generation procedure when the gases A and B are introduced alternately as the basic sequence are shown.

Figure 8:
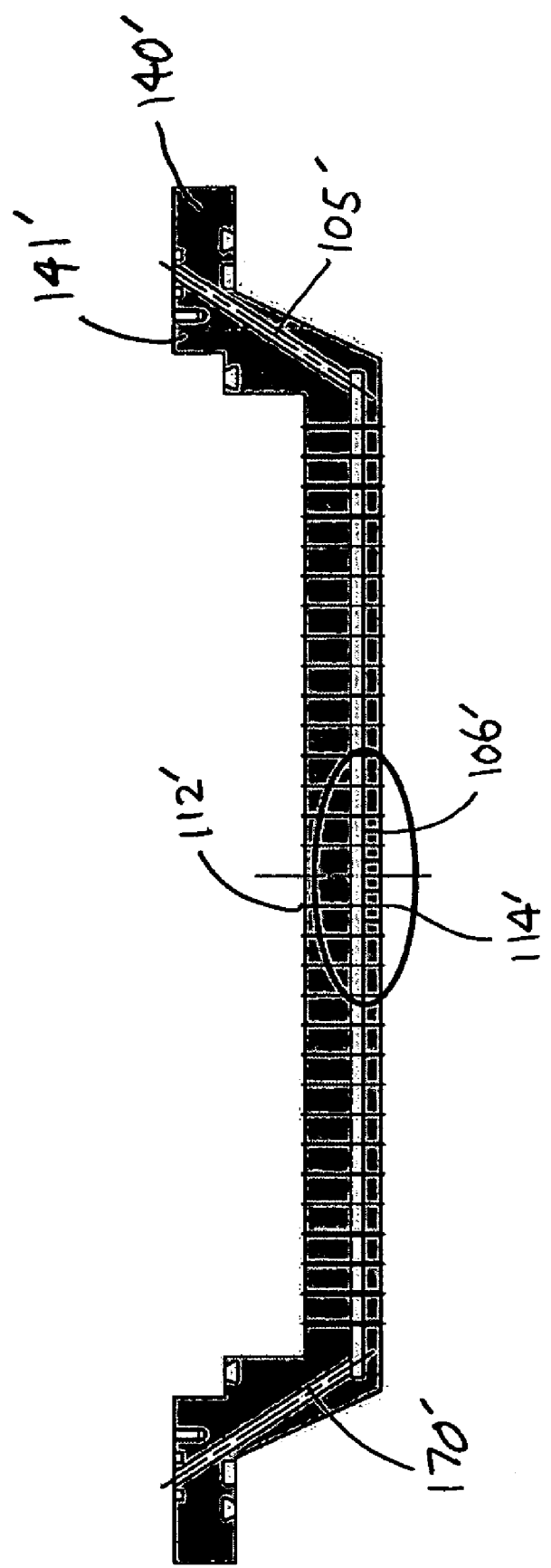
FIG. 8 is a schematic cross sectional view showing a showerhead plate having lower bores in a central area which is circled with an oval according to an embodiment of the present invention.
Figure 9:
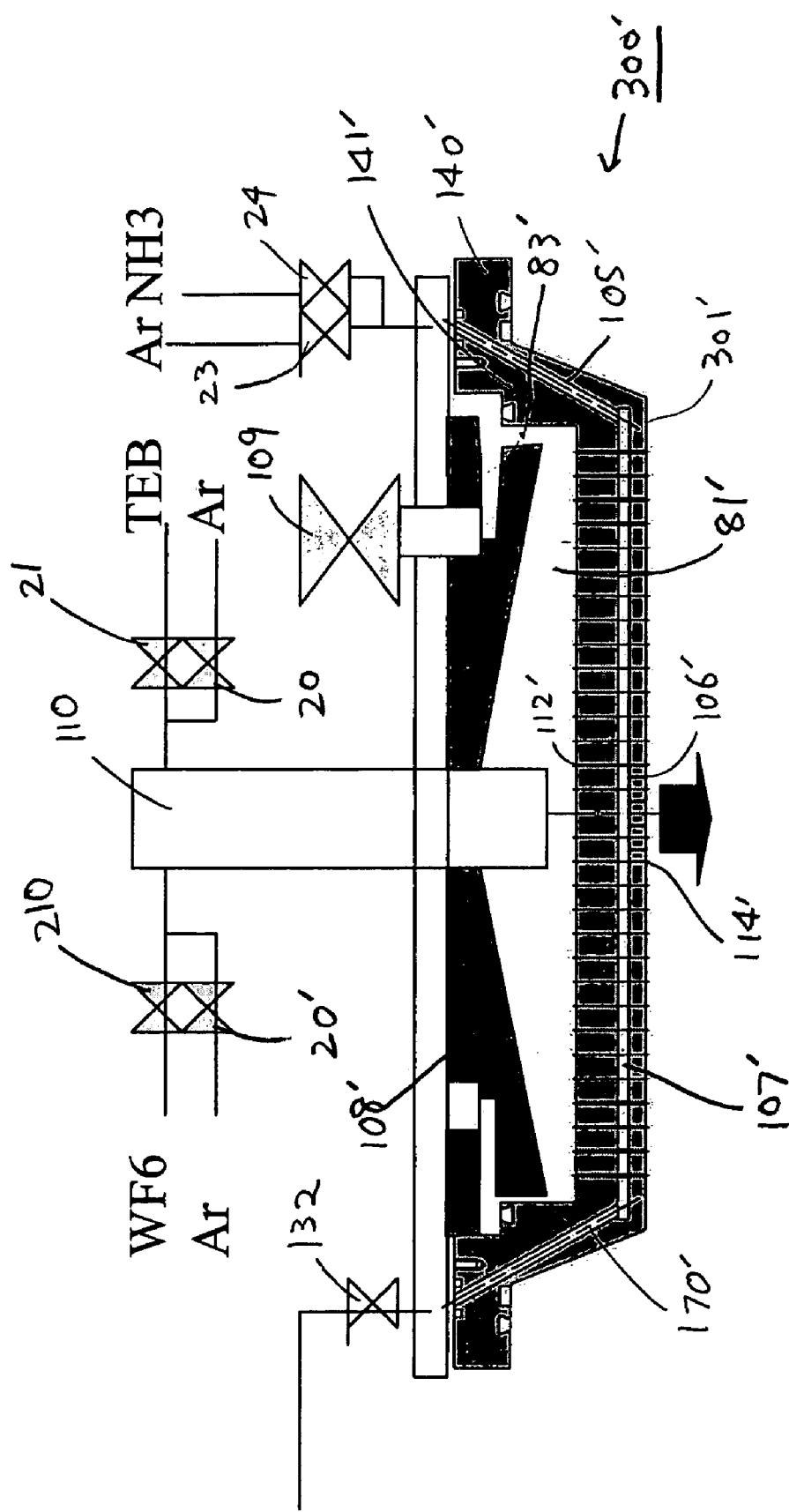
FIG. 9 is a schematic cross sectional view showing a showerhead according to an embodiment of the present invention.
Figure 10:
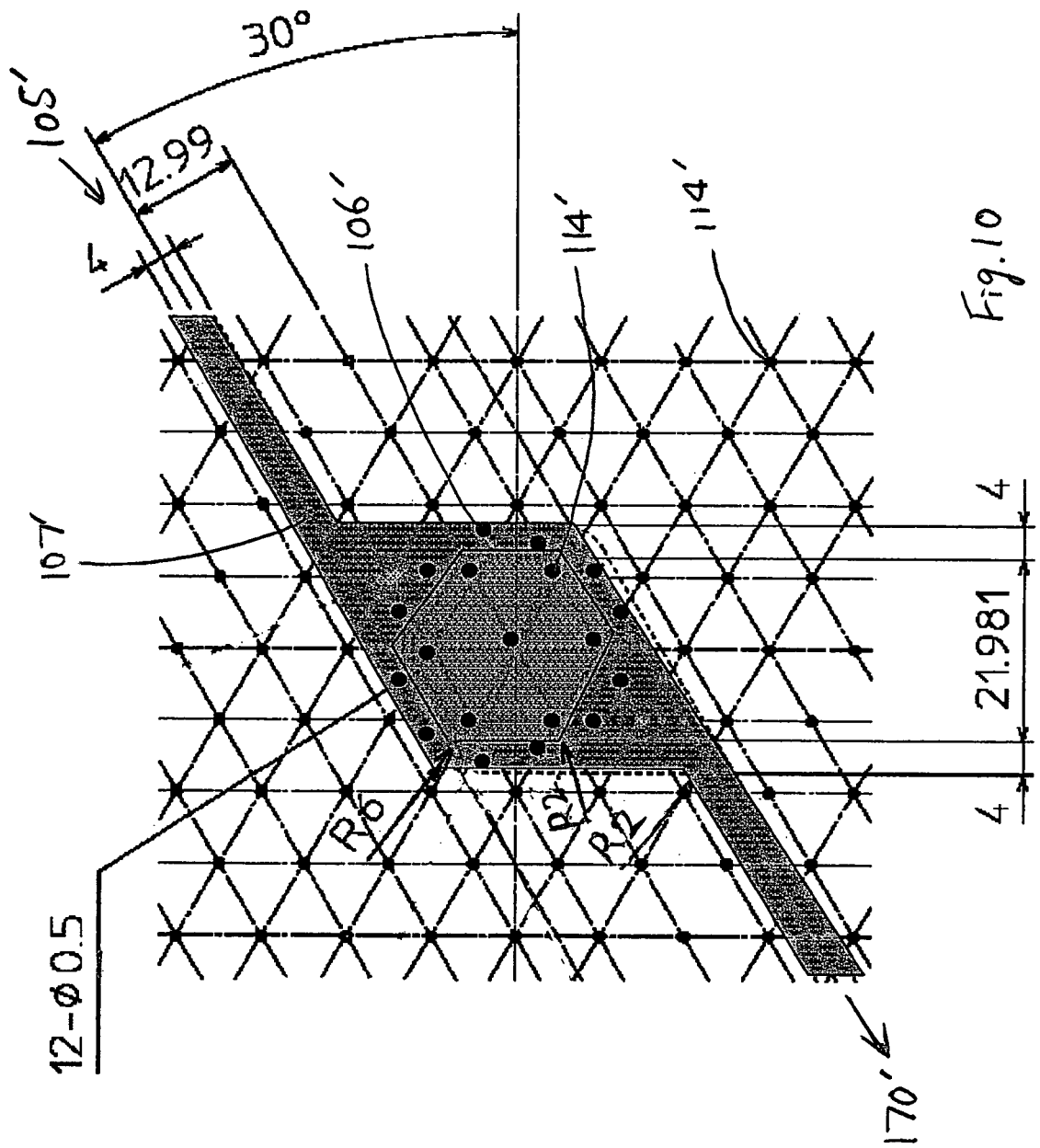
FIG. 10 is a partial schematic bottom view of a showerhead plate according to an embodiment of the present invention.

FIGS. 8-10 show another embodiment of the present invention. FIG. 8 shows a shower plate comprised of an upper shower plate 141' and a lower shower plate 140' (having a head surface 301'), between which a gas feed port 105' and an exhaust path 170' are formed. An upper surface of the upper shower plate 141' constitutes a first section, and a lower surface of the lower shower plate 140' constitutes an interior of a reaction chamber. A second section is formed between the upper shower plate 141' and the lower shower plate 140'. The first section and the interior of the chamber are communicated with each other through bores 112' which are formed in the upper shower plate and bores 114' which are formed in the lower shower plate 140'. The bores 112' and the bores 114' are communicated with each other and form continuous paths from the first section to the interior of the chamber. The bores 112' and 114' are distributed uniformly on the upper surface of the upper shower plate 141' and on the lower surface (the head surface) 301' of the lower shower plate 140', respectively. In contrast, the second section and the interior of the chamber are communicated with each other through bores 106' which are formed in the lower shower plate 140' exclusively at a central area of the lower shower plate 140'.

FIG. 10 shows an embodiment of the bores 106' (a partial bottom view of the lower shower plate), wherein the sizes are indicated in mm. In this embodiment, there are 12 bores arranged at constant intervals along a circle having a radius of 12.99 mm. The diameter of the bore is 0.5 mm. The bores 114' are formed uniformly on the lower surface of the lower shower plate, including the center portion which are surrounded by the second section 107'. The second section 107' are arranged without substantially interfering with the bores 114', so that the first gas is discharged uniformly from the lower shower plate, regardless of the second section. Incidentally, in order to make gas flow smooth, corners may be rounded (R6, R2, R2).

FIG. 9 shows a schematic view of a gas feeding structure (a gas-distribution head 300') in addition to the shower plate. This schematic view omits details, and proportions and sizes are not accurate. Further, alignment, gaps, and clearances are not accurate. In this embodiment, the first gas such as WF6 is introduced through a valve 210 into a first section 81' through a central gas pipe 110 and along an inner surface of a gas guide 108'. WF6 is then discharged to the interior of the chamber which is under the lower surface (the head surface) 301' of the lower shower plate 140' through the bores 112' and 114'. When purging the first section 81', Ar is introduced through a valve 20' into the first section through the central gas pipe 110. The gas is purged from the first section through an annular gap 83' and a valve 109. TEB is introduced through a valve 21 into the first section 81' through the central gas pipe 110 and along the inner surface of a gas guide 108'. TEB is then discharged to the interior of the chamber which is under the lower surface of the lower shower plate 140' through the bores 112' and 114'. When purging the first section 81', Ar is introduced through a valve 20 into the first section through the central gas pipe 110. The gas is purged from the first section through an annular gap 83' and a valve 109. NH3 is introduced through a valve 24 into the second section 107' through a gas feed port 105'. NH3 is then discharged to the interior of the chamber which is under the lower surface of the lower shower plate 140' through the bores 106'. When purging the second section 107', Ar is introduced through a valve 23 into the second section through the gas feed port 105'. The gas is purged from the second section through an exhaust pat 170' and a valve 132.

PROCESS EXAMPLES

Specific examples are shown below, but the present invention should not be limited thereto.

Example 1

An example of implementing a specific process using the process apparatus having the structure shown in FIG. 1 is demonstrated; a process of depositing a TiN film using titanium tetrachloride (TiCl4) and ammonia (NH3) as material gases is demonstrated. After a silicon substrate is transferred from the vacuum transfer chamber (not shown) to the reaction chamber 1, remaining moisture, oxygen, etc. are exhausted thoroughly by a turbo pump 29. The substrate is moved to a prescribed position by an up-and-down mechanism of the substrate susceptor 2. At this time, a gap-between the showerhead plate 4 and a substrate surface is set within the range of about 2 mm to about 8 mm. In this example, the process was implemented with the gap set at 5 mm.

The table shown in FIG. 3 shows process sequences. The reaction chamber is evacuated from the exhaust duct 3. At this time, by narrowing a distance between the substrate susceptor 2 and the exhaust duct 3, reaction gases are mostly exhausted from the exhaust duct 3. The distance can also be eliminated by contacting the substrate susceptor 2 and the exhaust duct 3. In this example, however, by narrowing the distance between the substrate susceptor and the exhaust duct 3, and by controlling a pressure in a transfer space by controlling a nitrogen amount to be introduced, a reaction gas amount entering into the transfer chamber side can be controlled. A temperature of the substrate susceptor is maintained at 320° C. (100° C. to 700° C., preferably 250° C. to 450° C.).

As shown in the table, in Step 1, 500 sccm of Ar gas is fed from the valve 20 and valve 23. At process start, after the reaction chamber is evacuated through a valve 25 for approximately 30 seconds in this state, the process is started. TiCl4 gas is fed for a prescribed time by opening the valve 21. Normally, a material gas is fed for about 0.1 second to about 0.2 second. In Step 3, upon closing of the valve 21, the gas is exhausted from the showerhead side by opening the valve 9 at its maximum aperture. By opening the valve 22 nearly simultaneously, approximately 2000 sccm of purge gas is introduced. The purge gas is fed for about 0.1 seconds; TiCl4 gas remaining inside the gas-distribution chamber, in which the gas-distribution guide 8 is provided, is exhausted from the gas-distribution nozzle 11 and then from the gas conduit tube 10; the valve 22 is closed, and the valve 9 is closed.

In the next step, the valve 24 is opened, and 1000 sccm of NH3 gas is introduced. Normally, after the gas is fed for about 0.1 second to about 0.3 second, the valve 24 is closed. Nearly simultaneously the valve 32 is opened; gas inside the distribution portion 7 is exhausted. Nearly simultaneously, by increasing a flow rate of Ar gas from the valve 23 up to 2000 sccm, the inside of the distribution portion 7 is evacuated faster.

In the next step, the procedure returns to the first step, which is the TiCl4 gas introduction step; by repeating the steps for a prescribed number of times according to a targeted film thickness, film deposition can be achieved.

Using the method according to the present invention, TiCl4 gas can be fed from within the showerhead at uniform surface density; in a post-mixing-type showerhead, providing an exhaust port and an exhaust valve at respective gas-distribution portions accomplishes purging for exhausting material gases from the distribution chamber via the shower plate relatively faster, approximately one-digit faster. Consequently, a time required for one cycle can be shortened while vapor-phase reaction is controlled. Effect in this case depends on exhaust conductance of an exhaust portion connected to the showerhead. By setting exhaust conductance of respective gas-distribution portions of the showerhead at an approximately one-digit or more larger level as compared with exhaust conductance set for gas discharge ports of the shower plate, however, remaining gas was able to be exhausted extremely effectively.

In this example, 847 gas discharge ports 12 having a diameter of 1 mm respectively are provided, and a plate thickness is 30 mm; 847 gas discharge ports 6 having a diameter of 0.5 mm respectively are provided, and a thickness is 10 mm. Correspondingly, the exhaust valve conductance is large because an exhaust duct having a diameter of 40 mm is used. In this case, if the exhaust valve is not used, approximately 2.5 times more purging time becomes required if material gases are purged only from the showerhead plate. When material gases are exhausted from the exhaust valve, purging can be completed in 0.1 to 0.05 seconds.

Using the thin-film deposition apparatus according to this embodiment of the present invention, TiCl4 and NH3 were able to be discharged extremely efficiently from the exhaust valve provided in the showerhead; with a post-mixing construction provided, thin-film deposition inside the showerhead was able to be controlled, and a TiN film was able to be formed at an extremely high productivity rate. Similar effect can be achieved using WF6 and NH3, WF6 and TEB (tetraethylboron) and NH3, etc. as material gases. Particularly, in the case of WF6 and TEB and NH3, introducing TEB and NH3 from one side of the showerhead, atomic layer growth can be achieved efficiently while reaction between WF6 and NH3 is controlled.

Example 2

In this example, a tantalum nitride film deposition process using Tertiaryamylimidotris(dimethylamido)tantalum: TaN (C4H9)(NC2H6)3, which is an organic metal material of Ta, and NH3 as material gases, is demonstrated. An apparatus shown in FIG. 5 has a structure that a RF field through 32 is added to the apparatus shown in FIG. 1 so that RF can be applied to the shower plate 4'. In this case, the substrate susceptor is grounded, and RF is applied to the shower-plate side. After a silicon substrate is transferred to the reaction chamber 1 from the vacuum transfer chamber (not shown), remaining moisture, oxygen, etc. are thoroughly exhausted by a turbo pump 29. The substrate is moved to a prescribed position by the up-and-down mechanism of the substrate susceptor 2. At this time, a gap between the distribution plate 4 and a substrate surface is set at about 2 mm to about 8 mm. In this example, the process was implemented with the gap set at 5 mm.

A process sequence is shown in the table indicated in FIG. 6. Gases, etc. in the reaction chamber are evacuated from the exhaust duct 3. At this time, by narrowing a distance between the substrate susceptor 2 and the exhaust duct 3, reaction gases are mostly exhausted from the exhaust duct 3. The distance can also be eliminated by contacting the substrate susceptor 2 and the exhaust duct 3. In this example, however, by narrowing the distance between the substrate susceptor 2 and the exhaust duct 3, and by controlling a pressure in a transfer space by controlling an introduction amount of nitrogen gas, a reaction gas amount entering into the transfer-chamber side can be controlled. A temperature of the substrate susceptor is maintained at 320° C. (100° C. to 700° C., preferably 250° C. to 450° C.).

As shown in the table, in Step 1, 500 sccm of Ar gas is fed from a valve 20 and a valve 23. At process start, after the reaction chamber is evacuated for approximately 30 seconds in this state, the process is started. TaMO gas is fed for a prescribed time by opening the valve 21. Normally, a material gas is fed for about 0.1 second to about 0.2 second. In Step 3, upon closing of the valve 21, the gas is exhausted from the showerhead side by opening the valve 9 at its maximum aperture. By opening the valve 22 nearly simultaneously, approximately 2000 sccm of purge gas is introduced. The purge gas is fed for about 0.1 second; TaMO gas remaining inside the gas-distribution chamber, in which the gas-distribution guide 8 is provided, is exhausted from the gas-distribution nozzle 11 and then from the gas conduit tube 10; the valve 22 is closed, and the valve 9 is closed.

In the next step, the valve 24 is opened and 1000 sccm of N2/H3 mixed gas is introduced. About 0.1 second to 0.3 second later, plasma is generated normally for about 0.1 second to about 0.3 second, and the valve 24 is closed. Nearly simultaneously the valve 32 is opened; gas inside the distribution portion 7 is exhausted. Nearly simultaneously, by increasing a flow rate of Ar gas from the valve 23 up to 2000 sccm, the inside of the distribution portion 7 is evacuated faster.

In the next step, the procedure returns to the first step, which is the TaMO gas introduction step; by repeating the steps for a prescribed number of times according to a targeted film thickness, film deposition can be achieved.

Using the method according to this embodiment of the present invention, TaMO gas can be fed from the showerhead at uniform surface density; in a post-mixing-type showerhead, providing an exhaust port and an exhaust valve at respective gas-distribution portions accomplishes purging for exhausting material gases from the distribution chamber via the shower plate relatively faster, approximately one-digit faster. Consequently a time required for one cycle can be shortened while vapor-phase reaction is controlled. Effect in this case depends on exhaust conductance of an exhaust portion connected to the showerhead. By setting an exhaust conductance level of respective gas-distribution portions of the showerhead at an approximately one-digit or more larger as compared with exhaust conductance set for gas discharge ports of the shower plate, however, remaining gas was able to be exhausted extremely effectively.

In this example, 847 gas discharge ports 12 having a diameter of 1 mm respectively are provided, and a plate thickness is 30 mm; 847 gas discharge ports 6 having a diameter of 0.5 mm respectively are provided, and a thickness is 10 mm. Correspondingly, the exhaust valve conductance is large because an exhaust duct having a diameter of 40 mm is used. In this case, if the exhaust valve is not used, approximately 2.5 times more purging time becomes required if material gases are purged only from a showerhead plate. When material gases are exhausted from the exhaust valve, purging can be completed in 0.1 to 0.05 seconds.

Using the thin-film deposition apparatus according to this embodiment of the present invention, TaMO gas and N2/H2 mixed gas were able to be discharged extremely efficiently from the exhaust valve set up in the showerhead, and with a post-mixing construction provided, thin-film deposition inside the showerhead was able to be controlled and a TaN film was able to be formed at an extremely high productivity rate. Similar effect can be achieved using WF6 and N2/H2, WF6 and TEB (tetraethylboron) and N2/Ar, etc. as material gases. Particularly, in the case of WF6 and TEB and N2/Ar, by introducing TEB and N2/Ar from one side of the showerhead and by applying plasma only when N2/Ar is fed, a thin film can be deposited efficiently. Particularly, in the case of N2/H2 or N2/Ar, purging these gases is not required because they do not react if plasma application is stopped; hence a purging time can be shortened. Consequently, in this case, it is also acceptable to provide an exhaust port of the showerhead only on the TaMO gas side. If TEB and N2/Ar gas are fed from the same showerhead side, however, providing exhaust ports of the showerhead in both distribution portions is effective to improve throughput. In this example, it is designed that RF plasma is generated between the shower plate and a substrate placed on the susceptor. As shown in FIG. 7, needless to say, it can be constructed that plasma can be generated in one of the distribution chambers by inserting an insulation ring 33 and grounding 34 the shower plate. In this case, N2/H2 or N2/Ar plasma is generated inside the showerhead distribution chamber and is fed from the showerhead to a substrate, and a thin film is deposited.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A gas-feeding apparatus connected to an evacuatable reaction chamber provided with a support for placing a substrate thereon, a gas-distribution head for introducing gases into the chamber through a head surface, comprising: a first plate having exclusively a first flow channel for discharging a first gas therein through the first flow channel and the head surface toward the support; and a second plate constituting the head surface and an exhaust path and disposed under the first plate, said second plate having both the first flow channel and a second flow channel which is for discharging a second gas through the second flow channel and the head surface toward the support, wherein there is no gas-mixing between the first flow channel and the second flow channel, said exhaust path is coupled to an exhaust system for purging therefrom a gas present in the corresponding flow channel without passing through the head surface, said first and second plates being stratified parallel to each other in a direction perpendicular to their axial direction and being overlapped as viewed in the axial direction, said second plate being closer to the head surface than is the first plate.

2. The gas-feeding apparatus according to claim 1, wherein at least the first flow channel is coupled to the exhaust system for purging a gas present in the first flow channel without passing through the head surface.

3. The gas-feeding apparatus according to claim 1, wherein the second flow channel is coupled to the exhaust system for purging a gas present in the second flow channel without passing through the head surface.

4. The gas-feeding apparatus according to claim 1, wherein the first flow channel and the second flow channel are both respectively coupled to exhaust systems, for purging a gas present in the corresponding flow channel without passing through the head surface.

5. The gas-feeding apparatus according to claim 2, wherein the first flow channel has a volume which is larger than that of the second flow channel.

6. The gas-feeding apparatus according to claim 2, wherein the first flow channel and the second flow channel are overlapped as viewed in the axial direction.

7. The gas-feeding apparatus according to claim 6, wherein the first flow channel and the second flow channel are gas-separately communicated with the head surface through a plurality of bores, respectively, wherein there is an overlapping area on the head surface where the first flow channel and the second flow channel are overlapped as viewed in the axial direction and both the bores of the first flow channel and the bores of the second flow channel are provided.

8. The gas-feeding apparatus according to claim 2, wherein the first flow channel comprises a central distribution inlet and a cone-shaped distribution plate extending radially therefrom.

9. The gas-feeding apparatus according to claim 4, wherein the first plate has bores communicating the first flow channel, and the second plate has bores communicating the first flow channel and bores communicating the second flow channel.

10. The gas-feeding apparatus according to claim 9, wherein the bores communicating the second flow channel and the head surface are disposed predominantly in a central area of the head surface, whereas the bores communicating the first flow channel and the head surface are uniformly distributed on the head surface including the central area.

11. The gas-feeding apparatus according to claim 10, wherein the second flow channel has a prolonged shape in the gas-distribution head.

12. The gas-feeding apparatus according to claim 9, wherein the bores communicating the first flow channel and the head surface have a total opening area on the head surface which is larger than that of the bores communicating the second flow channel and the head surface.

13. The gas-feeding apparatus according to claim 9, wherein the bores communicating the first flow channel and the head surface have an average bore size which is larger than that of the bores communicating the second flow channel and the head surface.

14. The gas-feeding apparatus according to claim 2, further comprising an RF power source for exerting RF power exclusively onto an interior of the second flow channel.

15. The gas-feeding apparatus according to claim 14, wherein the RF power source is coupled to the first plate which physically separates and insulates the first flow channel from the second flow channel, and the head surface is grounded.

16. The gas-feeding apparatus according to claim 1, further comprising an RF power source coupled to the gas-distribution head to exert RF power onto an interior of the reaction chamber.

17. The gas-feeding apparatus according to claim 2, wherein the first flow channel is coupled to a source gas line and a purge gas line, and the second flow channel is coupled to an additive gas line and a purge gas line.

18. The gas-feeding apparatus according to claim 1, which is connected to an evacuatable reaction chamber provided with a support for placing a substrate thereon.

19. The gas-feeding apparatus according to claim 18, wherein a space between the head surface and the support is coupled to an exhaust system.

20. The gas-feeding apparatus according to claim 19, wherein the exhaust system for purging therefrom a gas present in the first or second flow channels and the exhaust system for evacuating the space between the head surface and the support are connected and merged to a single exhaust line.

21. A gas-feeding apparatus connected to an evacuatable reaction chamber for atomic layer growth processing, comprising: a distribution plate; a first plate having exclusively first bores through which a first gas passes, wherein a first section is formed between the distribution plate and the first plate, wherein the first gas is introduced into the first section and passes through the first bores; and a second plate having second bores through which a second gas passes, wherein a second section is formed between the first plate and the second plate, wherein the second gas is introduced into the second section and passes through the second bores, said second plate further having third bores through which the first gas passes, wherein there is no gas communication between the third bores and the second bores, but there is gas communication between the third bores and the first bores, wherein the second plate is disposed above the support, the first plate is disposed above the second plate, and the distribution plate is disposed above the first plate, the first plate and the second plate are overlapped as viewed in their axial direction where the second plate has both the second bores and the third bores and the first plate has the first bores only, either both the first section and the second section is coupled to an exhaust system or the second section is coupled to an exhaust system exclusively which discharges the gas in the corresponding section without passing through the corresponding bores.

22. The gas-feeding apparatus according to claim 21, wherein the first plate and the second plate are disposed parallel to each other, and the distribution plate has a cone shape.

23. The gas-feeding apparatus according to claim 21, wherein the distribution plate is provided with a first gas inlet disposed in a central area of the distribution plate for introducing the first gas into the first section.

24. The gas-feeding apparatus according to claim 21, wherein the second section is provided with a second gas inlet disposed in the vicinity of an outer periphery of the second section.

25. The gas-feeding apparatus according to claim 21, wherein the first section is coupled to the exhaust system, wherein the first gas present in the first section is exhausted around an outer periphery of the distribution plate.

26. The gas-feeding apparatus according to claim 21, wherein the second section is coupled to the exhaust system, wherein the second gas present in the second section is exhausted through a second gas outlet disposed in the vicinity of an outer periphery of the second section.

27. The gas-feeding apparatus according to claim 21, wherein the second bores are disposed predominantly in a central area of the second plate.

28. The gas-feeding apparatus according to claim 21, wherein the first bores are distributed uniformly on the first plate, and the third bores are disposed right under the respective first bores.

29. The gas-feeding apparatus according to claim 21, wherein the third bores have a total opening area which is larger than that of the second bores.

30. The gas-feeding apparatus according to claim 21, wherein the third bores have an average bore size which is larger than that of the second bores.

31. The gas-feeding apparatus according to claim 27, wherein the second section is coupled to the exhaust system and is provided with a second gas inlet and a second gas outlet near an outer periphery of the second section, wherein the second section has a prolonged shape from the inlet to the outlet via the central area having the second bores.

* * * * *

UNITED STATES PATENT AND TRADEMARK OFFICE
CERTIFICATE OF CORRECTION

PATENT NO. : 7,273,526 B2
APPLICATION NO. : 10/824798
DATED : September 25, 2007
INVENTOR(S) : Hiroshi Shinriki and Junichi Arami Page 1 of 1

It is certified that error appears in the above-identified patent and that said Letters Patent is hereby corrected as shown below:

1. At column 16, line 38, in Claim 1, after "thereon" please insert -- comprising: --.

2. At column 16, line 41, in Claim 1, after "gas" please delete "therein."

3. At column 16, line 67, in Claim 1, after "systems" please delete ",".

Signed and Sealed this

Twenty-ninth Day of April, 2008

JON W. DUDAS
*Director of the United States Patent and Trademark Office*